(12) United States Patent
Li

(10) Patent No.: US 9,704,719 B2
(45) Date of Patent: Jul. 11, 2017

(54) SYSTEMS AND METHODS TO MITIGATE NITRIDE PRECIPITATES

(71) Applicant: Taiwan Semiconductor Manufacturing Co., Ltd., Hsin-Chu (TW)

(72) Inventor: Jung-Jui Li, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 449 days.

(21) Appl. No.: 13/942,906

(22) Filed: Jul. 16, 2013

(65) Prior Publication Data

US 2015/0024600 A1    Jan. 22, 2015

(51) Int. Cl.
*H01L 21/311* (2006.01)
*H01L 21/02* (2006.01)
*H01L 21/762* (2006.01)

(52) U.S. Cl.
CPC .... *H01L 21/31116* (2013.01); *H01L 21/0206* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 8,455,352 B1* | 6/2013 | Zheng et al. | 438/663 |
| 2006/0153331 A1* | 7/2006 | Rink et al. | 378/74 |
| 2008/0160719 A1* | 7/2008 | Lee | 438/426 |
| 2009/0101626 A1* | 4/2009 | Arndt et al. | 216/84 |
| 2009/0275205 A1* | 11/2009 | Kiehlbauch et al. | 438/712 |
| 2010/0210099 A1* | 8/2010 | Hur et al. | 438/586 |
| 2011/0117714 A1* | 5/2011 | Levy et al. | 438/296 |
| 2013/0029495 A1 | 1/2013 | Adhiprakasha | |

\* cited by examiner

*Primary Examiner* — Michael Wieczorek
*Assistant Examiner* — Bradford Gates
(74) *Attorney, Agent, or Firm* — Eschweiler & Potashnik, LLC

(57) ABSTRACT

A method of fabricating a semiconductor device is disclosed. A substrate having an oxide layer is provided. At least a portion of the oxide layer is removed and forms a nitride layer. The nitride layer is removed, leaving nitride precipitates. The nitride precipitates are removed using phosphoric acid.

20 Claims, 7 Drawing Sheets

SYSTEMS AND METHODS TO MITIGATE NITRIDE PRECIPITATES

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

One layer often used in semiconductor devices is silicon dioxide, also referred to as oxide. Oxide layers are used for transistor gates, capacitors, and the like. One challenge is forming oxide layers having a specific or set thickness.

DETAILED DESCRIPTION

Figure 1:
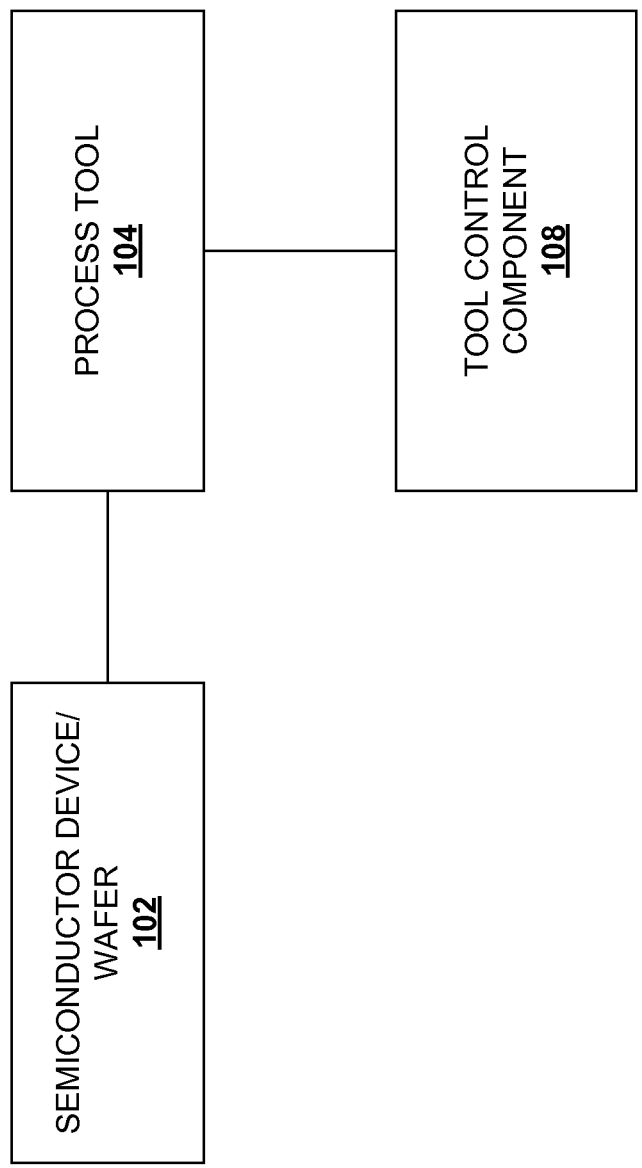
FIG. 1 is a block diagram illustrating an example semiconductor device fabrication system.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Generally, semiconductor fabrication involves performing a relatively large number or process steps on a wafer or semiconductor material in order to produce a desired semiconductor integrated circuit. The fabrication process is a multiple-step sequence of photolithographic and chemical processing steps during which electronic circuits are gradually created on a wafer composed of a semiconducting material.

The process steps can be broken down into front end of line (FEOL) processing and back end of line (BEOL) processing. In one example, over 300 sequenced process steps are required to form an integrated circuit on a semiconductor wafer.

FIG. 1 is a block diagram illustrating a semiconductor device fabrication system 100. The system 100 can be utilized to remove nitride related precipitate from semiconductor devices during fabrication. The removal process utilizes phosphoric acid.

The system 100 includes a process tool 104 and a control component 106. The system operations on a semiconductor device or wafer 102. The semiconductor device 102 includes an oxide layer.

The process tool 104 can include one or more tools, temperature chambers, and the like that are utilized in semiconductor fabrication. The control component 106 initiates a process to remove at least a portion of the oxide layer using the process tool. The oxide removal process uses nitride related materials, such as HF, NF3. The process also forms an unwanted nitride film (NH4)2SiF6, which is then removed by heating. However, nitride relative precipitate remains.

The control component initiates a phosphoric acid based removal process using the process tool. The phosphoric acid based removal process is performed to remove the nitride relative precipitate. Substantially all of the precipitate is removed. Additional details are described in the methods below.

Figure 2:
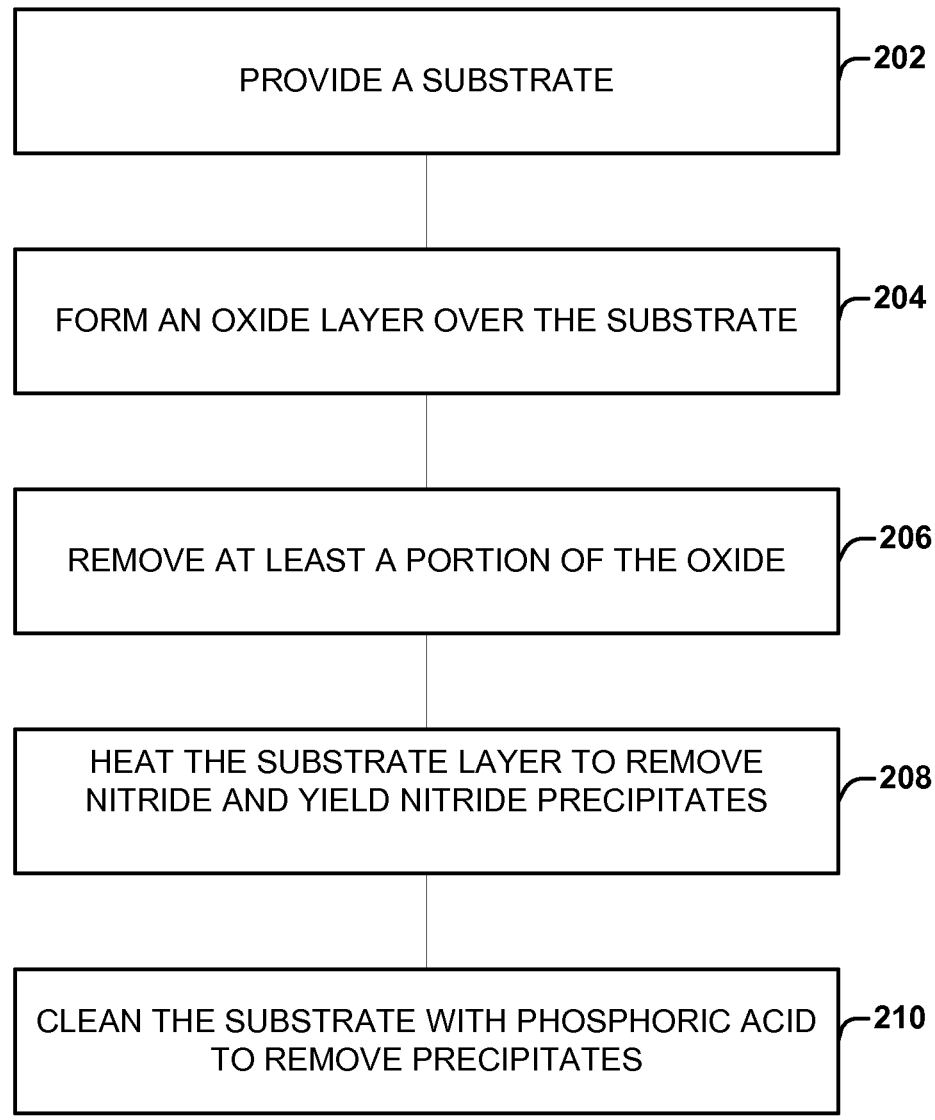
FIG. 2 is a flow diagram illustrating a method or removing nitride related precipitate from a semiconductor device.

FIG. 2 is a flow diagram illustrating a method 200 or removing nitride related precipitate from a semiconductor device. The precipitate forms as a byproduct of an oxide removal process.

The method 200 is described in conjunction with FIGS. 3A to 3D in order to facilitate understanding. However, it is appreciated that the extra figures are provided for illustrative purposes and are not intended to limit the method 200 to the arrangements shown therein. FIGS. 3A to 3D depict a semiconductor device fabricated using the method 200.

The method 200 begins at block 202, where a semiconductor substrate is provided. The substrate is part of a semiconductor device and is comprised of a semiconductor material, such as Silicon. The substrate can include one or more layers and/or structures.

An oxide layer is formed over the substrate at block 204. The oxide layer is formed to have a selected thickness using a suitable process. In one example, the oxide layer is grown using a silicon dioxide growth process. In another example, the oxide layer is formed using a deposition process. The oxide layer can be for a gate oxide, a capacitor oxide, or other purpose.

Figure 3A:
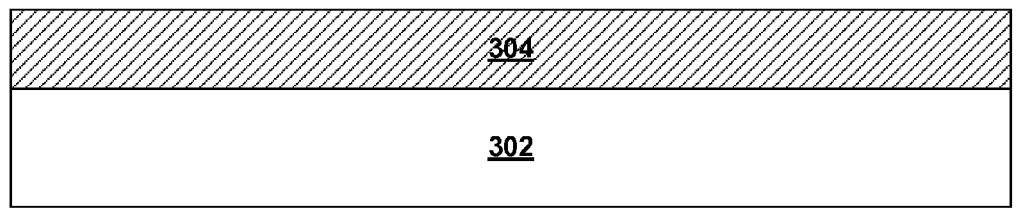
FIG. 3A is a cross sectional view of a semiconductor device fabricated using the method.

FIG. 3A is a cross sectional view of a semiconductor device fabricated using the method 200. The device is described for illustrative purposes.

The device includes a substrate 302 and an oxide layer 304. The oxide layer 304 has been formed over the substrate 302 as described in block 204.

At least a portion of the oxide layer is removed/consumed at block 206 using a nitride related process. The nitride related process reacts with the oxide layer to form a nitride layer which consumes the portion of the oxide layer. The portion of the oxide layer is removed using ambient conditions including HF and NH3 (ammonia) gas. The HF and}

NH3 react with the oxide layer to form a nitride film, (NH4)2SiF6. The nitride film can be removed later by a heating process.

In one example, the semiconductor device is placed on a stage in a chamber. The temperature is set within a range of 20 to 50 degrees C. The chamber includes HF and NH3 gas which reacts with the surface of the oxide layer to form a polymer. The NH3 acts as a catalytic agent. The wall temperature of the chamber over 60 degrees C. prevents polymer deposit and keeps or maintains a HF/NH3 concentration. The HF/NH3 ratio is typically in the range of 0.1 to 1 in order to remove the portion of the oxide layer by forming the nitride layer, (NH4)2SiF6. The ratio is selected to yield a particular etch rate. Generally, the higher the NH3 concentration, the higher the etch or oxide consumption rate. By selecting the time and ratio, the thickness of the portion to be removed and the thickness of the remaining oxide layer can be obtained.

Figure 3B:
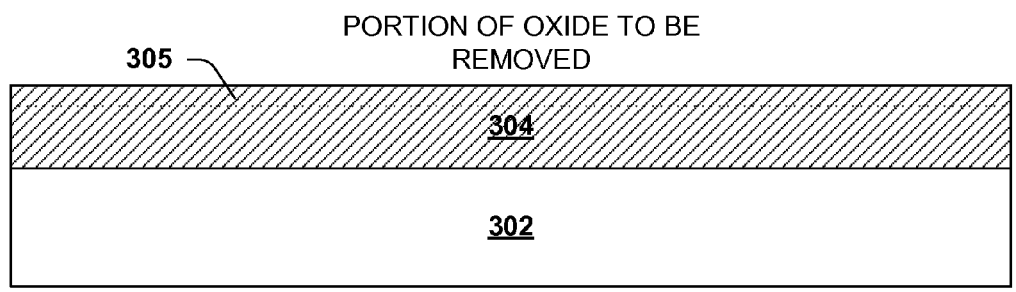
FIG. 3B is a cross sectional view of the semiconductor device prior to removal of the oxide portion.

FIG. 3B is a cross sectional view of the semiconductor device prior to removal of the oxide portion. A portion 305 of the oxide layer 304 is shown and highlighted. This portion is to be removed using the oxide removal process of block 206.

The substrate of the device is heated to remove the nitride layer at block 208. The heating substantially removes the nitride layer and results in the oxide layer having the selected thickness. However, the heating process results in formation of nitride relative precipitates, which include polymers, on and about the oxide layer. Some examples of the nitride relative precipitates include, NO−, NO2−, NO3−, NH4+, NH2OH, NH2(OH), and the like.

In one example, the heating process to remove the nitride layer includes the following. The semiconductor device is placed in a chamber on a heating stage. The stage is set to a temperature over about 90 degrees C. This temperature causes the nitride material, (NH4)2SiF6, to evaporate from the device's surface as a gas-phase byproduct. The byproduct is removed from the chamber using an exhaust or other mechanism. Some amount of the byproduct remains on the surface of the oxide layer. The remaining byproduct is referred to as the nitride relative precipitate. The nitride relative precipitate can impact device performance. The precipitate can induce defects and lower yield.

Figure 3C:
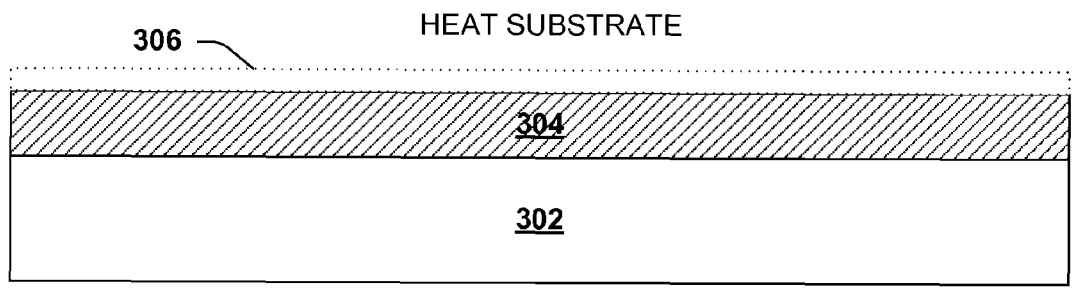
FIG. 3C is a cross sectional view of the semiconductor device after removal of the oxide portion and the heat based nitride removal process.

FIG. 3C is a cross sectional view of the semiconductor device after removal of the oxide portion and the heat based nitride removal process. The oxide layer 304 is shown formed over the substrate 302. The oxide removal process of block 206 has been performed to thin the oxide layer 304. Additionally, the heat based nitride removal process of block 208 has been performed to remove nitride. However, nitride relative precipitates 306 remain on the surface of the oxide layer 304.

Returning to the method 200, the substrate and the device are cleaned with phosphoric acid at block 210. The cleaning process removes the nitride precipitates from the surface of the oxide layer. The phosphoric acid removes substantially all the precipitates.

In one example the semiconductor device or wafer is dipped in phosphoric acid to remove the nitride precipitates. The phosphoric acid is set to a selected temperature and solution ratio. The temperature is typically set from 20 to 180 degrees C. and the solution ratio is generally set at about 80 to 95%.

Figure 3D:
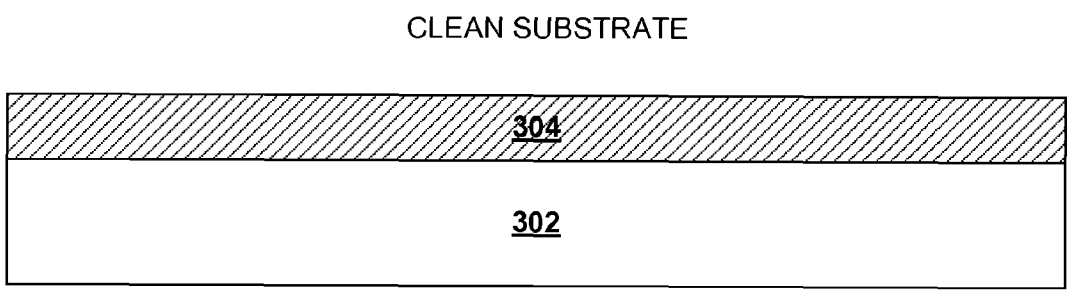
FIG. 3D is a cross sectional view of the semiconductor device after a phosphoric acid based cleaning process.

FIG. 3D is a cross sectional view of the semiconductor device after a phosphoric acid based cleaning process. The semiconductor device includes the oxide layer 304 formed over the substrate 302. The oxide layer 304 has the portion removed and nitride byproducts are not present. The phosphoric acid cleaning based process described in block 210 was utilized.

Figure 4:
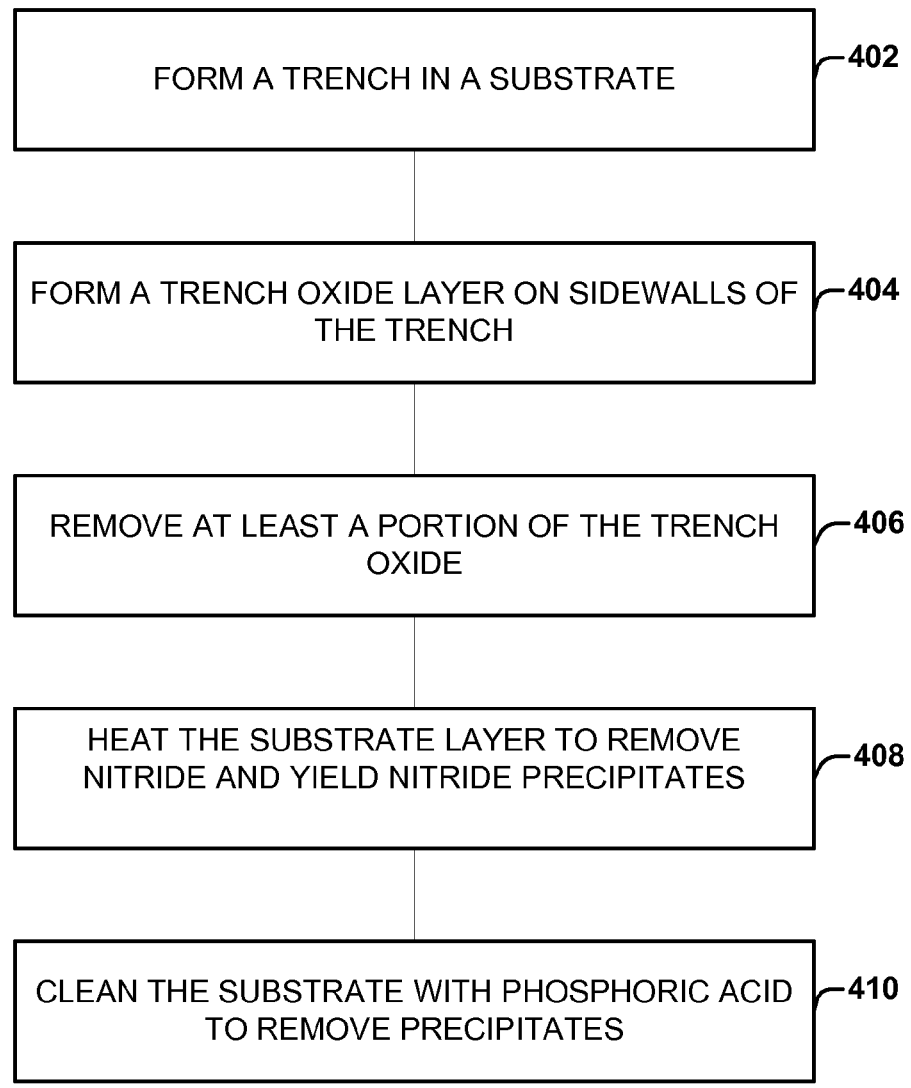
FIG. 4 is a flow diagram illustrating a method or removing nitride relative precipitate from an oxide layer within a shallow trench isolation region of a semiconductor device.

FIG. 4 is a flow diagram illustrating a method 400 or removing nitride relative precipitate from an oxide layer within a shallow trench isolation region of a semiconductor device. The precipitate forms as a byproduct of an oxide removal process. The removal of the precipitate can mitigate defects and enhance yield.

The method 400 is described in conjunction with FIGS. 5A to 5D in order to facilitate understanding. However, it is appreciated that these figures are provided for illustrative purposes and are not intended to limit the method 400 to the arrangements shown therein. FIGS. 5A to 5D depict a semiconductor device fabricated using the method 400.

A trench is formed a substrate at block 402. The substrate is part of a semiconductor device and includes an oxide layer formed over or on the substrate and a silicon nitride layer formed over or on the oxide layer. The oxide layer is formed to have a selected thickness using a suitable process. The silicon nitride layer similarly is formed to have a selected thickness. The substrate is part of a semiconductor device and is comprised of a semiconductor material, such as Silicon. The substrate can include one or more layers and/or structures in addition to the oxide layer and the silicon nitride layer. The trench is formed through the oxide layer, the silicon nitride layer, and into the substrate.

Figure 5A:
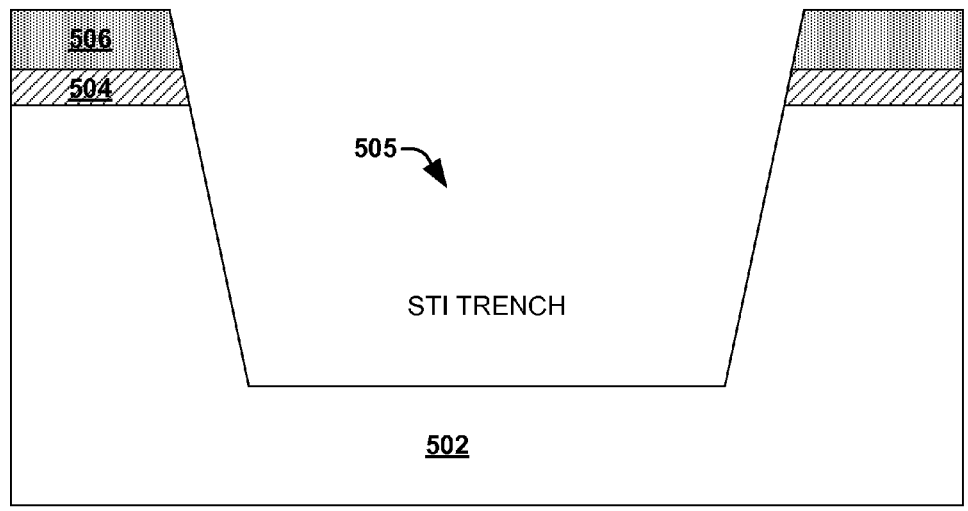
FIG. 5A is a cross sectional view of a semiconductor device fabricated using the method and shows a trench formed in the device.

FIG. 5A is a cross sectional view of a semiconductor device fabricated using the method 400 and shows a trench formed in the device. The device is described for illustrative purposes.

The device includes a substrate 502, a nitride layer 506 and an oxide layer 504. The oxide layer 504 has been formed over the substrate 502. The nitride layer 506 has been formed over the oxide layer 504. A trench region 505 has been formed as shown.

A trench oxide layer is formed on sidewalls of the trench at block 404. The trench oxide layer is formed to have a selected thickness using a suitable process. In one example, the trench oxide layer is grown using a silicon dioxide growth process. In another example, the trench oxide layer is formed using a deposition process.

Figure 5B:
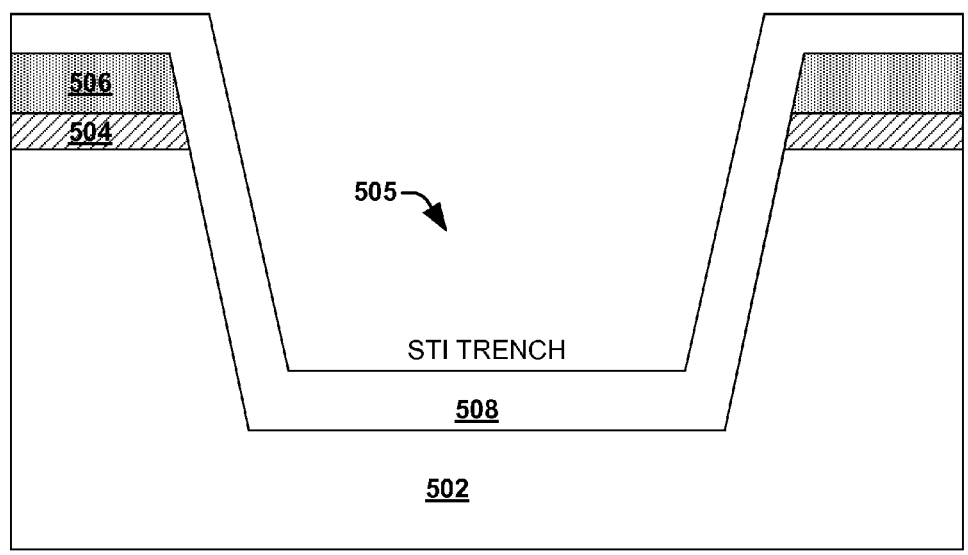
FIG. 5B is a cross sectional view of the semiconductor device having a trench oxide.

FIG. 5B is a cross sectional view of the semiconductor device having a trench oxide. The trench oxide 508 is formed over the substrate 502 and formed on a bottom and sidewalls of the trench 505.

At least a portion of the trench oxide layer is removed/consumed at block 406 using a nitride related process. The nitride related process reacts with the oxide layer to form a nitride layer which consumes the portion of the oxide layer. The portion of the oxide layer is removed using ambient conditions including HF and NH3 gas. The HF and NH3 react with the trench oxide layer to form a nitride film, (NH4)2SiF6. The nitride film can be subsequently removed by a heating process, as described below.

In one example, the semiconductor device is placed on a stage in a chamber. The temperature is set within a range of 40 to 50 degrees C. The chamber includes HF and NH3 gas which reacts with the surface of the oxide layer to form a polymer. The NH3 acts as a catalytic agent. The wall temperature of the chamber over 60 degrees C. prevents polymer deposit and keeps or maintains a HF/NH3 concentration. The HF/NH3 ratio is typically in the range of 0.1 to 1 in order to remove the portion of the oxide layer by forming the nitride layer, (NH4)2SiF6. The ratio is selected to yield a particular etch rate. By selecting the time and ratio, the thickness of the portion to be removed and the thickness of the remaining oxide layer can be obtained.

The substrate of the device is heated to remove the nitride layer at block 408. The heating substantially removes the nitride layer and results in the trench oxide layer having the selected thickness. However, the heating process results in formation of nitride relative precipitates, which include polymers, on and about the oxide layer. Some examples of the nitride relative precipitates include, NO−, NO2−, NO3−, NH4+, NH2OH, NH2(OH), and the like.

In one example, the heating process to remove the nitride layer includes the following. The semiconductor device is placed in a chamber on a heating stage. The stage is set to a temperature over about 90 degrees C. This temperature causes the nitride material, (NH4)2SiF6, to evaporate from the device's surface as a gas-phase byproduct. The byproduct is removed from the chamber using an exhaust or other mechanism. Some amount of the byproduct remains on the surface of the oxide layer. The remaining byproduct is referred to as the nitride relative precipitate. The nitride relative precipitate can impact device performance. The precipitate can induce defects and lower yield.

Figure 5C:
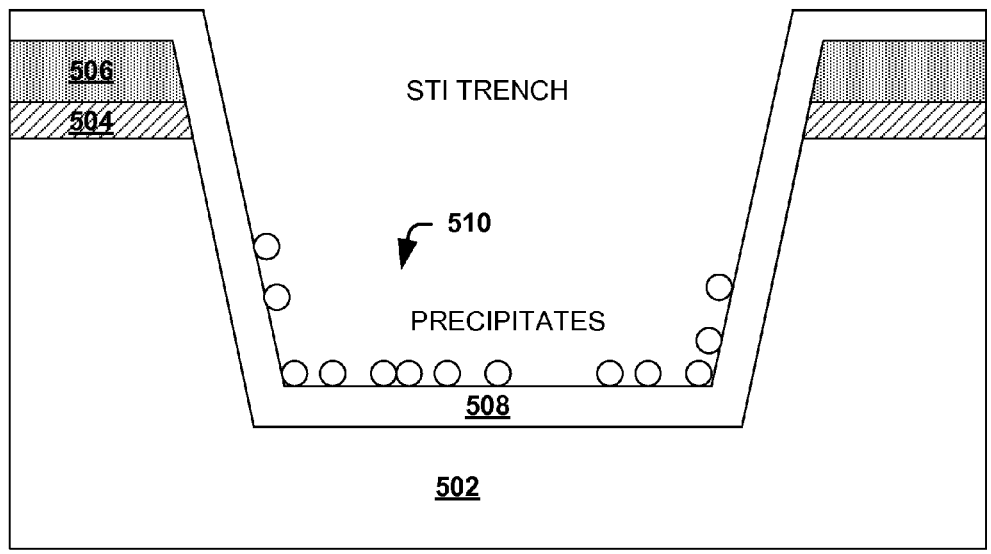
FIG. 5C is a cross sectional view of the semiconductor device after removal of the trench oxide portion and the heat based nitride removal process.

FIG. 5C is a cross sectional view of the semiconductor device after removal of the trench oxide portion and the heat based nitride removal process. The oxide removal process of block 406 has been performed to thin the trench oxide layer 508. Additionally, the heat based nitride removal process of block 408 has been performed to remove nitride. However, nitride relative precipitates 510 remain on the surface of the trench oxide layer 508, including its base and sidewalls.

Returning to the method 400, the substrate and the device are cleaned with phosphoric acid at block 410. The cleaning process removes the nitride precipitates from the surface of the trench oxide layer. The phosphoric acid removes substantially all the precipitates.

In one example the semiconductor device or wafer is dipped in phosphoric acid to remove the nitride precipitates. The phosphoric acid is set to a selected temperature and solution ratio. The temperature is typically set from 40 to 180 degrees C. and the solution ratio is generally set at about 80 to 95%.

Figure 5D:
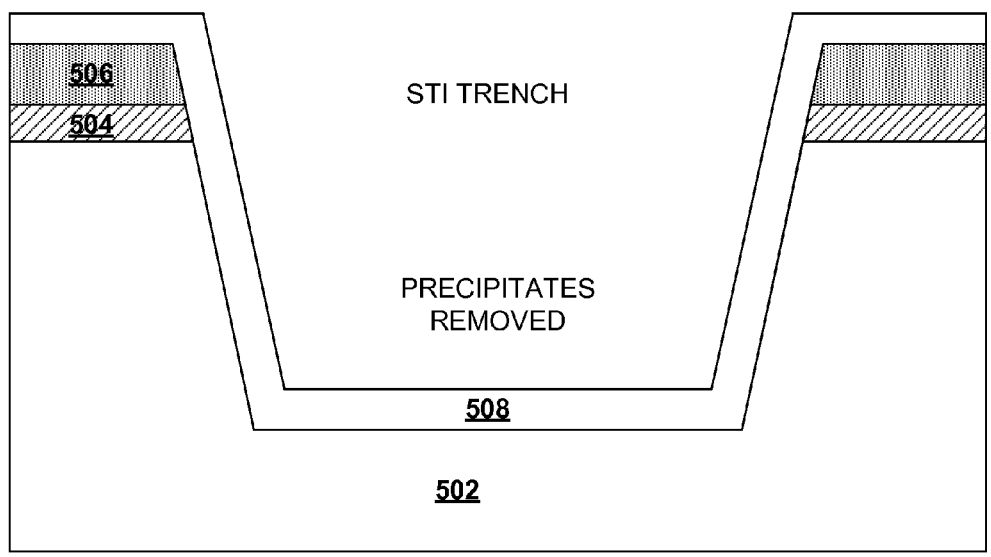
FIG. 5D is a cross sectional view of the semiconductor device after a phosphoric acid based cleaning process that removed the precipitates from the trench oxide layer.

FIG. 5D is a cross sectional view of the semiconductor device after a phosphoric acid based cleaning process that removed the precipitates from the trench oxide layer. The trench oxide layer 508 has the portion removed and nitride byproducts are no longer present present. The phosphoric acid cleaning based process described in block 410 was utilized.

It is appreciated that suitable variations of the method 200 and 400 are contemplated.

It will be appreciated that while reference is made throughout this document to exemplary structures in discussing aspects of methodologies described herein (e.g., the structure presented in above figures, while discussing the methodology set forth in above), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A method of fabricating a semiconductor device is disclosed. A substrate having an oxide layer is provided. At least a portion of the oxide layer is removed and forms a nitride layer. The nitride layer is removed, leaving nitride precipitates. The nitride precipitates are removed using phosphoric acid. In one example, removing at least a portion of the oxide layer includes placing the device on a stage in a chamber with HF and NH3 gas and the HF and NH3 gas reacting with the portion of the oxide layer to form the nitride layer.

Another method of fabricating a semiconductor device is disclosed. A substrate having an oxide layer formed on the substrate and a nitride layer formed on the oxide layer is provided. The substrate is heated to a selected temperature causing nitride material of the nitride layer to evaporate. The evaporated material is exhausted and forms nitride precipitates as a result. The oxide layer is cleaned with phosphoric acid to remove nitride precipitates.

A method of fabricating a semiconductor device is disclosed. A trench is formed within the substrate and has sidewalls and base portions. A trench oxide is formed over the trench region. The trench oxide has sidewalls and base portions. The trench oxide is exposed to HF and NH3 gas to consume a portion of the trench oxide layer into a nitride layer. The substrate is heated to evaporate and remove the nitride layer while forming nitride precipitates on the trench oxide. The nitride precipitates are removed using phosphoric acid. In one example, the substrate is provided, an oxide layer is formed over the substrate, and a silicon nitride layer is formed over the oxide layer prior to forming the trench.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of fabricating a semiconductor device, the method comprising:
   providing a substrate having an oxide layer;
   removing at least a portion of the oxide layer by reacting HF and $NH_3$ with the oxide layer to form a nitride layer over an unconsumed portion of the oxide layer;
   removing the nitride layer and leaving a nitride precipitate byproduct on the unconsumed portion of the oxide layer; and
   removing the nitride precipitate byproduct by dipping the substrate in a liquid solution of phosphoric acid.

2. The method of claim 1, wherein removing at least a portion of the oxide layer includes placing the device on a stage in a chamber with HF and $NH_3$ gas.

3. The method of claim 2, wherein the HF and $NH_3$ gas are provided with a ratio of about 0.1 to 1.

4. The method of claim 2, wherein the stage is set to a temperature within a range of about 20 to 50 degrees Celsius.

5. The method of claim 2, wherein a wall temperature of the chamber is set to over about 60 degrees Celsius in order to mitigate depositing nitride precipitate byproduct on the wall of the chamber.

6. The method of claim 1, wherein the nitride layer is formed as $(NH_4)_2SiF_6$.

7. The method of claim 1, further comprising forming the oxide layer over the substrate.

8. The method of claim 1, wherein removing the nitride layer includes heating the device and causing nitride material of the nitride layer to evaporate.

9. The method of claim 8, wherein heating the device includes placing the device on a stage within a chamber and bringing the stage to a temperature over about 90 degrees Celsius.

10. The method of claim 1, wherein the nitride precipitate byproduct includes one or more of $NO-$, $NO_2-$, $NO_3-$, $NH_4+$, $NH_2OH$, and $NH_2(OH)$.

11. The method of claim 1, wherein the liquid solution of phosphoric acid has a temperature of about 20 to 180 degrees Celsius.

12. The method of claim 1, further comprising forming a trench in the substrate.

13. A method of fabricating a semiconductor device, the method comprising:
   providing a substrate having an oxide layer formed on the substrate and a nitride layer formed over an unconsumed portion of the oxide layer;
   heating the substrate to a selected temperature causing nitride material of the nitride layer to evaporate;
   exhausting the evaporated material and forming a nitride precipitate as a result; and
   cleaning the oxide layer by dipping the substrate in a liquid solution of phosphoric acid to remove the nitride precipitate.

14. The method of claim 13, wherein the selected temperature is about 90 degrees C.

15. The method of claim 13, further comprising placing the substrate on a stage within a chamber.

16. The method of claim 13, wherein the liquid solution of phosphoric acid has a temperature of about 20 to 180 degrees Celsius.

17. A method of fabricating a semiconductor device, the method comprising:
   forming a trench region within a substrate, the trench region having sidewalls and base portions;
   forming a trench oxide over the trench region, the trench oxide having sidewalls and base portions;
   exposing the trench oxide to HF and $NH_3$ gas to convert a portion of the trench oxide into a nitride layer;
   heating the substrate to evaporate and remove the nitride layer while forming a nitride precipitate byproduct over an unconsumed portion of the trench oxide; and
   removing the nitride precipitate byproduct by dipping the substrate in a liquid solution of phosphoric acid.

18. The method of claim 17, wherein the nitride precipitate byproduct resides on the sidewalls of the unconsumed portion of the trench oxide prior to removal.

19. The method of claim 17, wherein the liquid solution of phosphoric acid has a temperature range of 20 to 180 degrees Celsius.

20. The method of claim 17, wherein heating the substrate includes placing the substrate on a stage within a chamber and bringing the stage to a temperature over about 90 degrees Celsius.

* * * * *